United States Patent
Matai et al.

[11] Patent Number: 5,752,174
[45] Date of Patent: May 12, 1998

[54] RADIO RECEIVER WITH AUTOMATIC ADJUSTMENT OF OSCILLATION FREQUENCIES

[75] Inventors: Masahiro Matai; Kunitoshi Yonekura, both of Tokyo, Japan

[73] Assignee: NEC Corporation, Tokyo, Japan

[21] Appl. No.: 282,238

[22] Filed: Jul. 29, 1994

[30] Foreign Application Priority Data

Jul. 31, 1993 [JP] Japan ................................. 5-208601

[51] Int. Cl.[6] ................................................. H04B 1/16
[52] U.S. Cl. ..................... 455/183.1; 455/302; 455/316
[58] Field of Search ........................ 455/183.1, 183.2, 455/197.1, 260, 296, 302, 314, 315, 317, 316, 186.1

[56] References Cited

U.S. PATENT DOCUMENTS

| | | | |
|---|---|---|---|
| 4,512,035 | 4/1985 | Victor et al. | 455/316 |
| 4,545,072 | 10/1985 | Skutta et al. | 455/215 |
| 4,575,761 | 3/1986 | Carlson et al. | 455/315 |
| 4,661,842 | 4/1987 | Ishige et al. | |
| 4,703,520 | 10/1987 | Rozanski, Jr. et al. | 455/183.1 |
| 4,817,195 | 3/1989 | Kubo et al. | 455/260 |
| 4,879,758 | 11/1989 | DeLuca et al. | 455/296 |
| 5,390,346 | 2/1995 | Marz | 455/260 |

FOREIGN PATENT DOCUMENTS 342921  2/1991  Japan.

*Primary Examiner*—Edward F. Urban
*Attorney, Agent, or Firm*—Sughrue, Mion, Zinn, Macpeak & Seas, PLLC

[57] ABSTRACT

A radio selective calling receiver having at least two, i.e., a first and a second, local oscillators constituted by respective synthesizers. The oscillation frequencies of the local oscillator are controlled by the apparatus including a frequency calculator for executing frequency calculations according to the received call signal frequency and the oscillation frequencies of the first and second local oscillators so that harmonics of either one of the oscillation frequencies are not interference frequencies to the other oscillation frequency or the received signal frequency.

12 Claims, 6 Drawing Sheets

CONVERSION TO 1ST. INTERMEDIATE FREQ.

CONVERSION TO 2ND. INTERMEDIATE FREQ.

CONVERSION FROM ANALOGUE TO DIGITAL

FIG. 6

|  | | FIRST LOCAL OSCILLATOR | |
|---|---|---|---|
| SECOND LOCAL OSCILLATOR | fL2L | NEGATIVE | POSITIVE |
|  | fL2U | POSITIVE | NEGATIVE |

5,752,174

RADIO RECEIVER WITH AUTOMATIC ADJUSTMENT OF OSCILLATION FREQUENCIES

BACKGROUND OF THE INVENTION

The present invention relates to radio selective calling receivers (hereinafter referred to merely as receivers) having synthesizers and, more particularly, to a receiver which uses synthesizers for local oscillators in a radio unit to prevent reception interference by local oscillation frequencies.

FIG. 4 is a block diagram showing a conventional receiver constitution. This type of receiver, as disclosed in Japanese Patent Application Laid-Open No. Heisei 3-42921, mainly comprises a radio unit 1 and a logic unit 2. The radio unit 1 is provided with first and second local oscillators 5 and 6. A call signal received by an antenna 10 is amplified in a high frequency amplifier 11 and then mixed in a first mixer 13 with a first local oscillation signal from a first local oscillator 5 for conversion to a signal of a first intermediate frequency $\Delta f_1$. The first intermediate frequency signal is mixed in a second mixer 15 with a second local oscillation signal from a second local oscillator 6 for conversion to a signal of a second intermediate frequency $\Delta f_2$. The intermediate frequency signal is then amplified in an amplifier 17, then limited in a limiter 18 to a constant amplitude, and detected in a detector 19. Designated at 12, 14 and 16 are filters for isolating spurious frequencies such as image frequency components. The first local oscillator (including an original oscillation) 5 has an oscillator 51 and a selective type frequency divider 52 for selectively outputting the oscillation frequency as a low or a high side frequency of a first intermediate frequency as will be described later. Likewise, the second local oscillator 6 has an oscillator 61 and a selective type frequency divider 62 for selectively outputting a low or high side frequency of a second intermediate frequency to be described later.

In the logic unit 2, the detected signal is converted by an A/D converter 20 into a digital signal, which is then subjected to signal processing through a decoder 21 and a CPU 24. At the reception time of a predetermined station call signal, according to the result of verification of the predetermined station call number, etc. stored in a ROM 22, a loudspeaker drive 25 is driven to sound a loudspeaker 26, and also a message or the like is displayed on a display 71. The decoder 21 and CPU 24 are operated by the respective clocks 29 and 30. The CPU 24 is provided with a polarity setting switch 72 for switching positive and negative logic polarities.

Normally, an FM modulated call signal is transmitted at a frequency of $(f_0-y)$ for a positive signal and at a frequency of $(f_0+y)$ for a negative signal. The frequency that is obtained as a result of the frequency conversion of the received signal by the first mixer 13 is $(\Delta f_1 \pm y)$ as shown in FIG. 5A, and the frequency obtained through the frequency conversion by the second mixer 15 is $(\Delta f_2 \pm y)$ as shown in FIG. 5B. As shown in FIG. 5C, the detector 19 converts the obtained frequency signals of $(\Delta f_2+y)$ and $(\Delta f_2-y)$ into $\Delta V_2$ and $\Delta V_1$, respectively. The A/D converter 20 in the logic unit 2 compares these voltages with a reference voltage Vref and, as a result, provides a digital signal with $\Delta V_1$ as a negative signal and $\Delta V_2$ as a positive signal.

It will be seen from FIGS. 5A and 5B that when the lower frequency $f_{L1L}$ than the received frequency is used, and when the higher frequency $f_{L1U}$ is used, as the frequency of the first local oscillator 5 supplied to the first mixer 13, the frequency of the obtained first intermediate frequency signal is inverted from $(\Delta f_1+y)$ to $(\Delta f_1-y)$ (or from $(\Delta f_1-y)$ to $(\Delta f_1+y)$). Likewise, the frequency of the second intermediate frequency signal is inverted from $(\Delta f_2+y)$ to $(\Delta f_2-y)$ (or from $(\Delta f_2-y)$ to $(\Delta f_2+y)$). Therefore, where the oscillation frequency of the first and second local oscillators 5 and 6 are changed between the low and high frequencies, it is necessary to switch the positive and negative logics in the logic unit 2. This is done by switching the polarity setting switch 72.

The relation between the transmitted FM signal and the converted digital signal will now be described.

The frequency of the FM signal transmitted from the transmitting station is $(f_0-y)$ ($f_0$ being the channel frequency) in case of positive signal (1) and $(f_0+y)$ in case of negative signal (0). In the radio unit, the frequency is reduced down to a frequency capable of demodulation for the conversion to the digital signal. FIGS. 5A and 5B show the frequency relation at the intermediate frequency. To obtain the first intermediate frequency $\Delta f_1$ in the first mixer 13, the first local oscillator frequency may be either $f_{L1L}$ or $f_{L1U}$. When $f_{L1L}$ is selected, the first intermediate frequency is $(\Delta f_1-y)$ for $(f_0-y)$ (positive signal) and $(\Delta f_1+y)$ for $(f_0+y)$ (negative signal). When $f_{L1U}$ is selected, however, the relation is inverted. Likewise, to obtain the second intermediate frequency $\Delta f_2$ in the second mixer 15, the second local oscillator frequency may be $f_{L2L}$ or $f_{L2U}$. Again, the converted frequency relation is inverted depending on the frequency selection.

When frequency conversion to the frequency $\Delta f_2$, which is capable of demodulation, is obtained through the two mixers, the detector 19, as shown in FIG. 5C, effects A/D conversion to provide $\Delta V_2$ for $(\Delta f_2+y)$ and $\Delta V_1$ for $(\Delta f_2-y)$, and a comparator having $V_{ref}$ as reference effects conversion to positive and negative digital signals.

Because of the above conversion, the logic of the demodulated digital signals with respect to the transmitted signals $(f_0-y)$ (positive signal) and $(f_0+y)$ (negative signal) is changed depending on the selection of the first and second local oscillator frequencies as shown in FIG. 6.

To cope with the logic change with the receiver frequency setting, the logic unit 2 is provided with the polarity setting switch 72. Generally, using a 0Ω resistor the logic unit input port is set to VDD (H) or to GND (L). With this setting, the comparator output data is processed in the positive or negative logic.

Since the second local oscillator frequency in the receiver is set to a frequency lower than the call signal frequency or the first local oscillator frequency, harmonics of the second local oscillator frequency may be in the neighborhood of the call signal frequency or the first local oscillator frequency and act as interference radiowaves to deteriorate the reception sensitivity and other characteristics. Like problems arise in the first local oscillator.

To avoid such problems, it is in practice to change the second local oscillator frequency from a frequency lower than the first intermediate frequency to a higher frequency. At this time, the positive and negative logic polarities in the decoder 21 in the logic unit are inverted. Thus, at this time, the polarity setting switch 72 is switched.

For effective frequency utility, it is in practice to assign different call signal frequencies for different areas (generally at a frequency interval of 25 KHz). This makes it necessary to change the second local oscillator frequency in correspondence to the call signal frequency received by the receiver to a frequency lower or higher than the first intermediate frequency such that the harmonics of the second local oscillator frequency will not act as interference frequencies, while also switching the polarity setting switch correspondingly. Such receiver setting requires cumbersome and time consuming operations such as the soldering for setting the CPU input port to VDD or GND.

SUMMARY OF THE INVENTION

An object of the invention is therefore to provide a receiver, which can effect automatic setting of the local oscillation signal frequencies such that the harmonics thereof will not act as interference radiowaves and also effect corresponding automatic polarity setting.

According to one aspect of the present invention, there is provided a radio selective calling receiver having at least two, i.e., first and second, local oscillators constituted by respective synthesizers, and control means for controlling the oscillation frequencies of the local oscillators, the control means including frequency calculation means for executing frequency calculation according to the received call signal frequency and the oscillation frequencies of the first and second local oscillators so that harmonics of either one of the oscillation frequencies are not interference frequencies to the other oscillation frequency or the received signal frequency.

According to another aspect of the present invention there is provided a radio selective receiver comprising: a first synthesizer for generating oscillation signals of a first higher frequency $f_{L1U}$ signal and a first lower frequency $f_{L1L}$ signal which are higher and lower than a first local oscillator frequency, respectively; a second synthesizer for generating a second higher frequency $f_{L2U}$ signal and a second lower frequency $f_{L2L}$ signal higher and lower than a second local oscillator frequency, respectively; memory means for storing call signal frequency data which are set for respective areas; an antenna for receiving a call signal; a first mixer for mixing the received signal with an output signal from the first synthesizer for conversion to a first intermediate frequency $\Delta f_1$; a second mixer for mixing the first intermediate frequency signal with an output signal from the second synthesizer for conversion to a second intermediate frequency $\Delta f_2$; a detector for detecting the signal of the second intermediate frequency; a first means for setting the oscillation frequencies of the first and second synthesizer to $f_{L1L}$ and $f_{L2L}$, respectively; a second means for checking whether harmonics of the second lower frequency $f_{L2L}$ from the second synthesizer act as interference frequencies with respect to the call signal frequency $f_0$ read out from the memory means or the first lower frequency $f_{L1L}$ signal from the first synthesizer; and a third means for setting, if there is an allowable harmonic acting as an interference frequency, the oscillation frequencies of the first and second synthesizers to $f_{L1L}$ and $f_{L2L}$. In the above receiver, it is possible to provide further means as follows: a fourth means for setting, if it is found that the oscillation frequency $f_{L2L}$ signal of the second synthesizer is prone to interference, the oscillation frequency of the second synthesizer to the second higher frequency $f_{L2U}$; a fifth means for checking whether harmonics of the second higher frequency $f_{L2U}$ from the second synthesizer act as interference frequencies with respect to the call signal frequency $f_0$ read out from the memory means or the first lower frequency $f_{L1L}$ from the first synthesizer; a sixth means for setting, if there is an allowable harmonic acting as an interference frequency, the oscillation frequencies of the first and second synthesizers to $f_{L1L}$ and $f_{L2U}$; a seventh means for setting, if it is found that there is an interference frequency, the oscillation frequencies of the first and second synthesizers to the first higher frequency and second lower frequency $f_{L1U}$ and $f_{L2L}$, respectively; an eighth means for checking whether harmonics of the second lower frequency $f_{L2L}$ from the second synthesizer act as interference frequencies with respect to the call signal frequency $f_0$ read out from the memory means or the first lower frequency $f_{L1U}$ from the first synthesizer; a ninth means for setting, if there is an allowable harmonic acting as an interference frequency, the oscillation frequencies of the first and second synthesizers to $f_{L1U}$ and $f_{L2L}$; a tenth means for setting, if there still is interference, the oscillation frequencies of the first and second synthesizers to the first higher frequency and second higher frequency $f_{L1U}$ and $f_{L2U}$, respectively; and an eleventh means for setting, if selecting any oscillation frequencies of the first and second synthesizers leads to an interference situation the individual frequencies such as to set the least effect of the intermediate frequency situation.

According to other aspect of the present invention there is provided a heterodyne receiver comprising: a first synthesizer for generating oscillation signals of a first higher frequency $f_{L1U}$ signal and a first lower frequency $f_{L1L}$ signal which are higher and lower than a first local oscillator frequency, respectively; a second synthesizer for generating a second higher frequency $f_{L2U}$ signal and a second lower frequency $f_{L2L}$ signal higher and lower than a second local oscillator frequency, respectively; memory means for storing call signal frequency data which are set for respective areas; an antenna for receiving a call signal; a first mixer for mixing the received signal with an output signal from the first synthesizer for conversion to a first intermediate frequency $\Delta f_1$; a second mixer for mixing the first intermediate frequency signal with an output signal from the second synthesizer for conversion to a second intermediate frequency $\Delta f_2$; a detector for detecting the signal of the second intermediate frequency; a first means for setting the oscillation frequencies of the first and second synthesizer to $f_{L1L}$ and $f_{L2L}$, respectively; a second means for checking whether harmonics of the second lower frequency $f_{L2L}$ from the second synthesizer act as interference frequencies with respect to the call signal frequency $f_0$ read out from the memory means or the first lower frequency $f_{L1L}$ signal from the first synthesizer; and a third means for setting, if there is allowable harmonic acting as interference frequency, the oscillation frequencies of the first and second synthesizers to $f_{L1L}$ and $f_{L2L}$.

Other objects and features of the present invention will be clarified from the following description with reference to attached drawings.

BRIEF DESCRIPTION OF THE DRAWINGS

FIG. 6 is a drawing showing a relationship of the change the logic of the demodulated digital signals with respect to the transmitted signals depending on the selection of the first and second local oscillator frequencies in FIG. 4.

DESCRIPTION OF THE PREFERRED EMBODIMENTS

Figure 1:
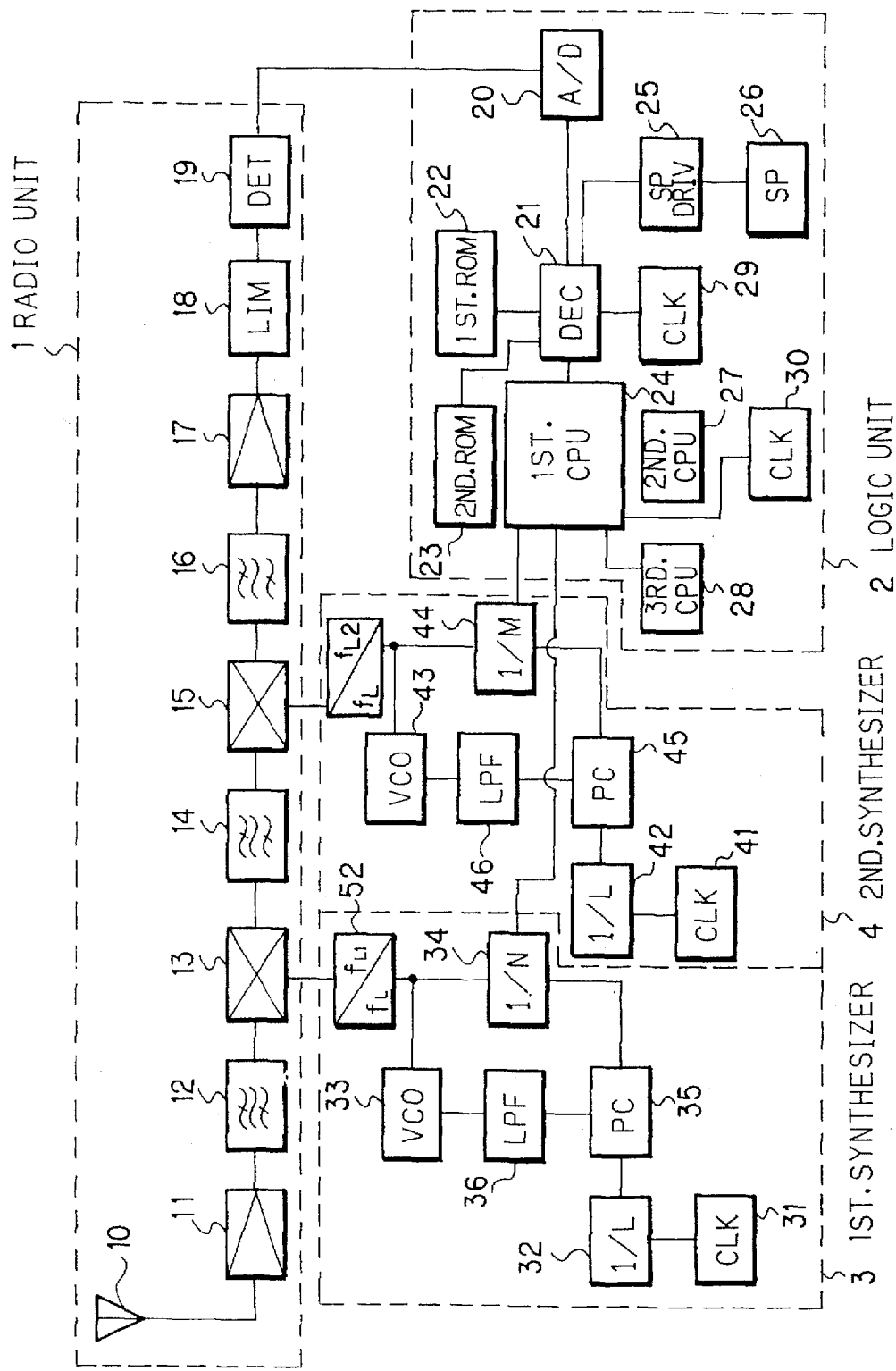
FIG. 1 is a block diagram showing an embodiment of the present invention.
Figure 4:
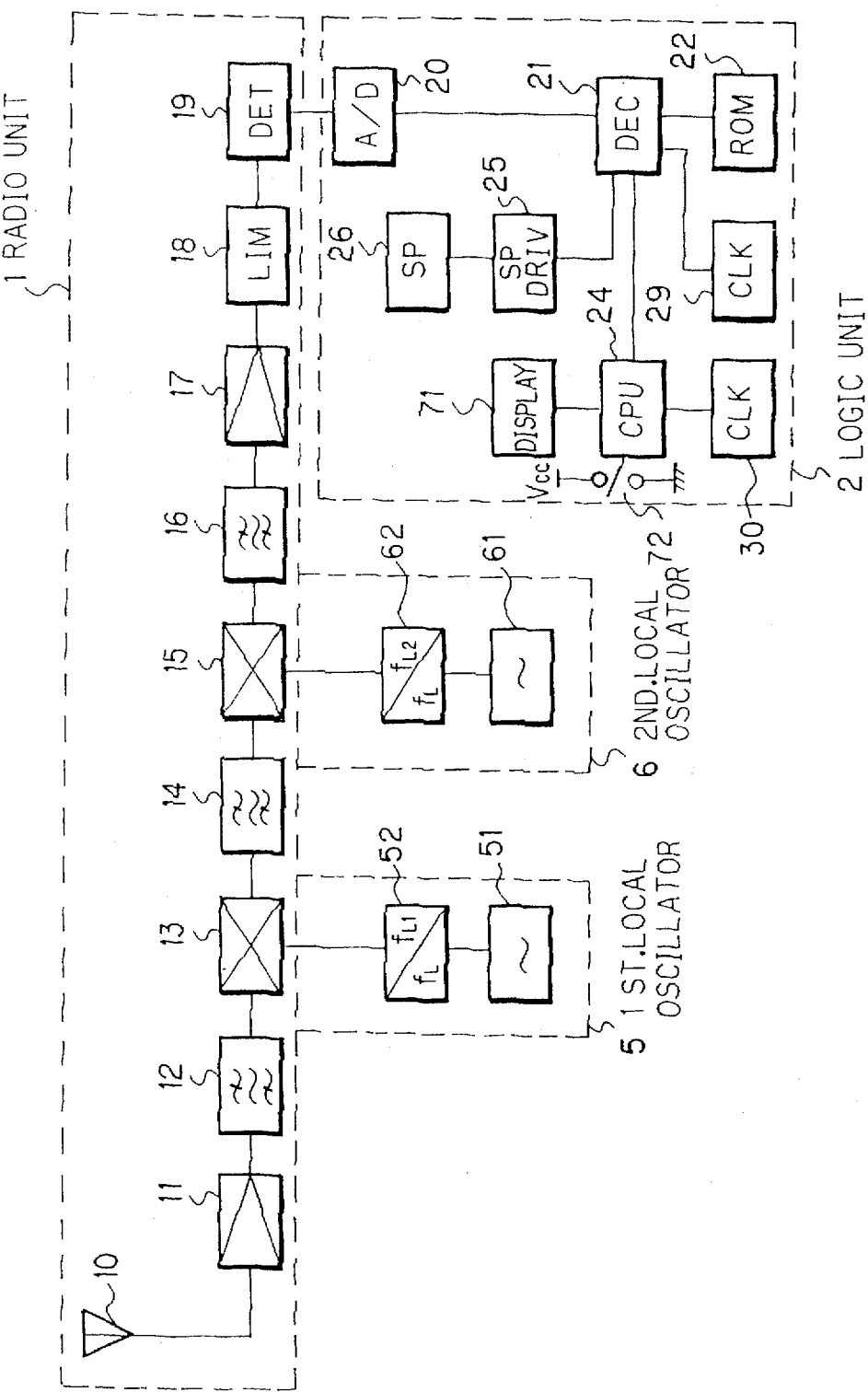
FIG. 4 is a block diagram showing a conventional receiver constitution.
Figure 5A:
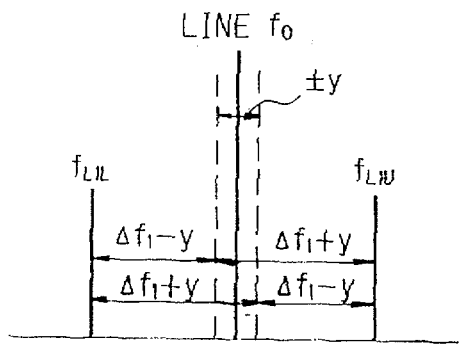
FIGS. 5A to 5C are drawings for describing the operation the prior art receiver.
Figure 5B:
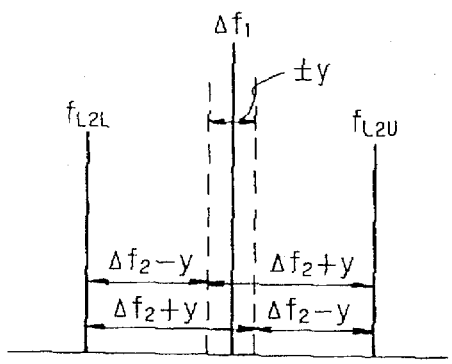
Figure 5C:
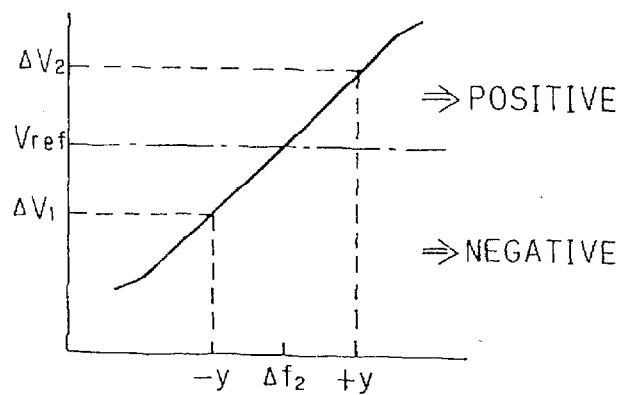

Now, the present invention will be described with reference to the drawings. FIG. 1 is a block diagram showing an embodiment of the present invention. Parts like those in the conventional constitution shown in FIG. 4 are designated by like reference numerals. In this instance, the first and second local oscillators provided in the radio unit 1 are constituted by respective independent first and second synthesizers 3 and 4.

In the first synthesizer 3, a clock signal from reference clock 31 is divided into L-ths in a frequency divider 32 to produce a reference frequency signal. The phase of this reference frequency signal is compared in a phase comparator 35 with a phase of a frequency signal which is obtained by frequency dividing the output of a voltage-controlled oscillator (VCO) 33 into N-ths in a frequency divider 34. The differential voltage obtained as the result of the comparison is supplied to the VCO 33 to obtain phase coincidence of both signals. The differential voltage from the phase comparator 35 contains clock components, which are thus eliminated through a low-pass filter 36.

The second synthesizer 4 likewise includes a reference clock 41, a frequency divider 42, a VCO 43, a phase comparator 45 and a low-pass filter 46, the frequency divider 44 dividing the VCO output into M-ths.

The logic unit 2 includes an A/D converter 20 and a decoder 21 and, in addition to the ROM 22, also includes a second ROM 23. In the second ROM 23 are stored call signal frequency data which are set for respective areas. Further, second and third CPUs 27 and 28 are provided in addition to the first CPU 24. The second CPU 27 calculates the relation between the call signal frequency and the oscillation frequency of the first synthesizer 3. The third CPU 28 sets data logic in accordance with the result of calculation in the second CPU 27. The first CPU 24 controls the frequency division ratios in the frequency dividers 34 and 44 in the first and second synthesizers 3 and 4 from the results of processing in the second and third CPUs 27 and 28, thus controlling the individual synthesizer oscillation frequencies.

In the radio unit 1, a call signal received by the antenna 10 is amplified by the high frequency amplifier 11 and mixed in the first mixer 13 with the first local oscillation signal from the first synthesizer 3 for conversion to the first intermediate frequency $\Delta f_1$. The first intermediate frequency signal is mixed in the second mixer 15 with the second local oscillation signal from the second synthesizer 4 for conversion to the second intermediate frequency $\Delta f_2$. The second intermediate frequency signal is amplified by the amplifier 17, then limited in the limiter 18 to a constant amplitude and then detected by the detector 19. The filters 12, 14 and 16 isolate spurious frequencies such as image frequencies.

In the logic unit 2, the detected signal is converted by the A/D converter 20 into a digital signal which is subjected to the signal processing through the decoder 21 and the CPU 24. When a predetermined station call signal is received, the loudspeaker 26 is operated with the loudspeaker drive 25 driven according to the result of verification of the a predetermined station call number or the like stored in the ROM 22. The clocks 29 and 30 are used for driving the decoder 21, the first CPU 24 and the second and third CPUs 27 and 28.

Figure 2:
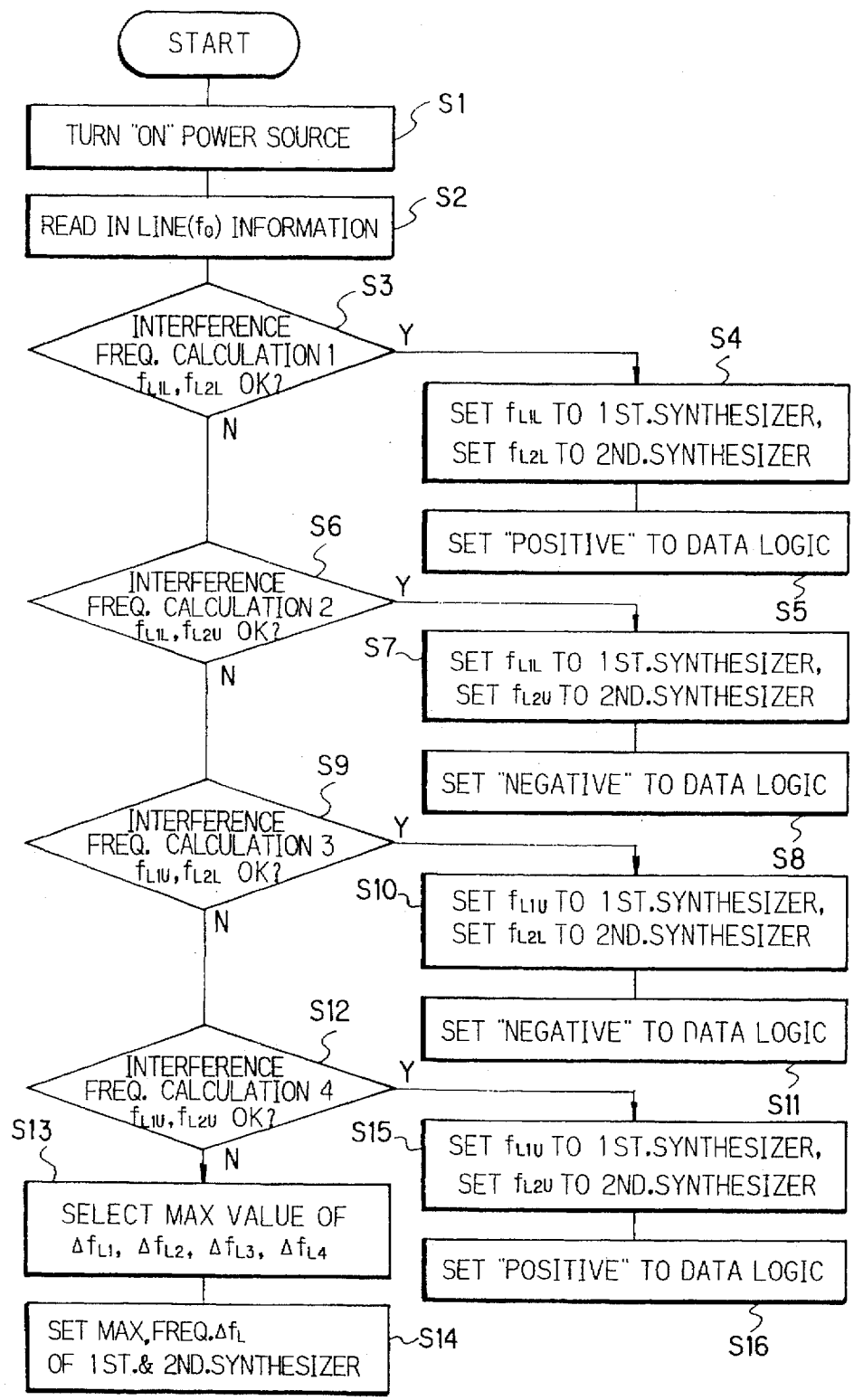
FIG. 2 is a flow chart illustrating the operation of the receiver in FIG. 1.

FIG. 2 is a flow chart illustrating the operation of this receiver. As shown, when the power source is turned on (step S1), the call signal frequency set in the receiver is read out from the second ROM 23 (step S2). Then, with the oscillation frequency of the first synthesizer 3 set to $f_{L1L}$ and that of the second synthesizer 4 set to $f_{L2L}$, the second CPU 27 performs calculations to check whether harmonics of the oscillation frequency $f_{L2L}$ of the second synthesizer 4 will act as interference frequencies with respect to the call signal frequency $f_0$ or the oscillation frequency $f_{L1L}$ of the first synthesizer 3 (step S3).

Figure 3:
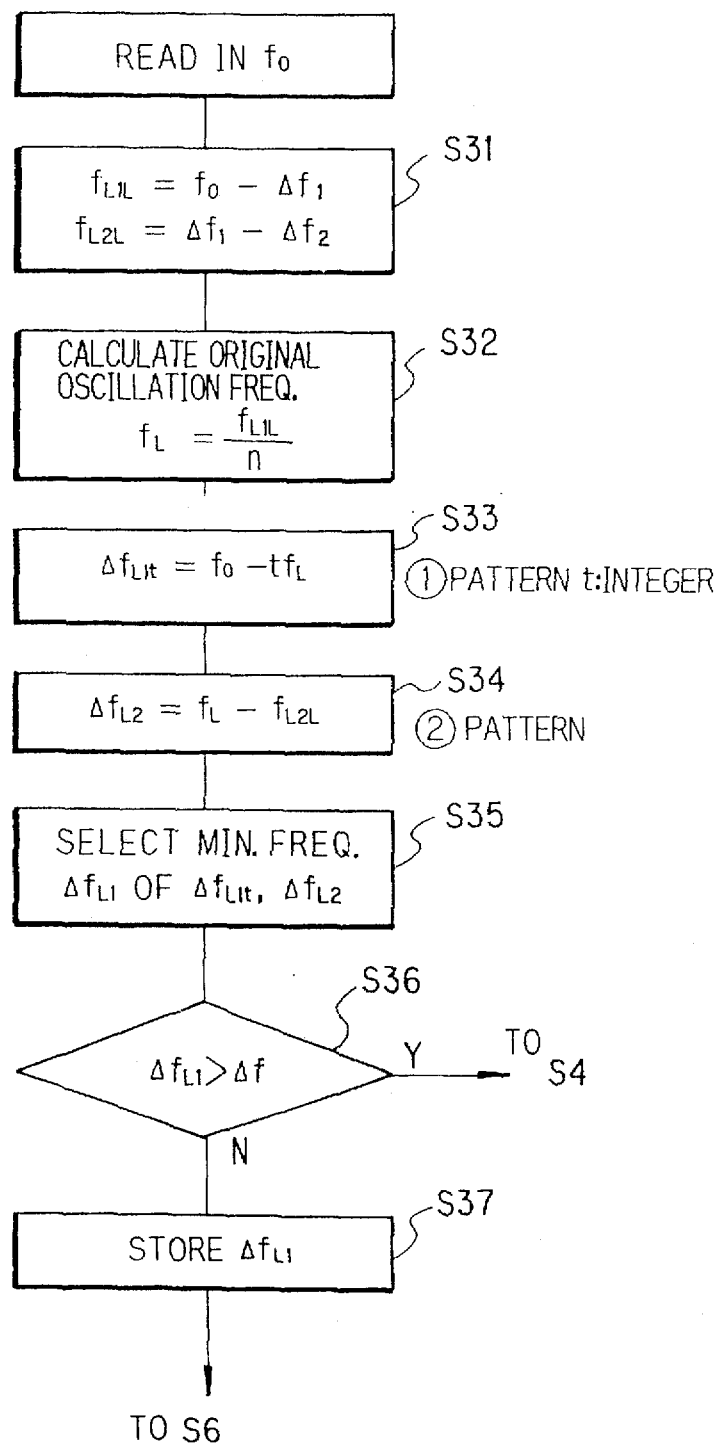
FIG. 3 is a flow chart illustrating an example of the interference frequency calculation routine in FIG. 2.

FIG. 3 is a flow chart illustrating an example of the interference frequency calculation routine. Although there are several different patterns in which the interference arises, in this example, only two patterns are shown. In this routine, using the call signal frequency $f_0$ read out from the second ROM 23, $f_{L1L}=f_0-\Delta f_1$ and $f_{L2L}=\Delta f_1-\Delta f_2$ are obtained (step S31). Then, the original oscillation frequency $f_L$ is obtained as $f_{L1L}/n$ (step S32), where $f_{L1L}$ is the first local oscillation frequency and n is the modulo number. Then the frequency difference $\Delta f_{L1t}$ (t being an integer) between the spurious frequency and the line frequency $f_0$ and also the frequency difference $\Delta f_{L2}$ between the original oscillation frequency and the second local oscillation frequency are obtained as $f_{L1t}=f_0-tf_L$ and $\Delta f_{L2}=f_L-f_{L2L}$ (steps S33 and S34). Here, $tf_L$ is spurious, and t is usually in a range of 1 to n. In this example, t=n is used as $f_{L1}$, and the others are spurious. If there is a spurious frequency near the predetermined local oscillation frequency, the local oscillation frequency is unstable.

Then, to provide the optimum local oscillation frequency, the worst interference frequency is selected. That is, the higher the $\Delta f_{L1}$ is, the lower the interference is. Thus, the minimum values of $\Delta f_{L1t}$ and $\Delta f_{L2}$ are selected (step S35), and $\Delta f_{L1}$ and $\Delta f$ are compared (step S36). If it is found in the step S36 that $\Delta f_{L1}$ is higher than $\Delta f$, the routine goes to the step S4. Otherwise, $\Delta f_{L1}$ is stored (step S37), and then the routine goes to the step S6.

If there is no harmonic acting as an interference frequency, the first CPU 24 sets the oscillation frequencies of the synthesizers 3 and 4 to $f_{L1L}$ and $f_{L2L}$ through the control of the frequency division ratios of the frequency dividers 34 and 44 (step S4). Also, the third CPU 28 sets a positive data logic (step S5).

If it is found as a result of the calculation in the second CPU 27 that the oscillation frequency $f_{L2L}$ of the second synthesizer 4 is prone to interference, this frequency is set to the high frequency $f_{L2U}$, and the second CPU 27 performs like calculation to check whether this frequency is prone to interference (step S6). This calculation is like the routine in FIG. 3 and is performed with $f_{L1L}=f_0-\Delta f_1$ and $f_{L2U}=\Delta f_1+\Delta f_2$. If it is found that there is no interference frequency, the oscillation frequencies of the first and second synthesizers 3 and 4 are set to the frequencies $f_{L1L}$ and $f_{L2U}$ (step S7), and a negative data logic is set by the third CPU 28 (step S8).

If it is found as a result of this calculation again that there is an interference frequency, the oscillation frequencies of the first and second synthesizers 3 and 4 are set to the high and low frequencies $f_{L1U}$ and $f_{L2L}$, respectively, and the second CPU 27 performs like calculation to check for any interference (step S9). If it is found that there is no interference frequency, the oscillation frequencies of the first and second synthesizers 3 and 4 are set to the frequencies $f_{L1U}$ and $f_{L2L}$, respectively (step S10), and the negative data logic is set by the third CPU 28 (step S11).

Subsequent to the step S9, interference frequency calculation is further executed in a similar step, and a check is done as to whether $f_{L1U}$ and $f_{L2U}$ are free from interference (step S12). If these frequencies are free from interference, the step S15 is executed. Otherwise, it is necessary to select a combination of the least effect local oscillation frequencies among the worst frequencies $\Delta f_{L1}$, $\Delta f_{L2}$, $\Delta f_{L3}$ and $\Delta f_{L4}$. To this end, in a step S13 the maximum one of the four frequency values is selected (step S13). Then, the first and second local oscillation frequencies are set to the maximum frequency $\Delta f_L$ (step S14).

If there still is interference, the oscillation frequencies of the first and second synthesizers 3 and 4 are set to the high frequencies $f_{L1U}$ and $f_{L2U}$, respectively (step S15), and the positive data logic is set (step S16).

It is thought that selecting any oscillation frequencies of the first and second synthesizers leads to an interference situation depending on the values of the first and second intermediate frequencies $\Delta f_1$ and $\Delta f_2$. In such case, the extent of the effect of the interference frequencies (the effect varying in dependence on the harmonic order) is stored, and the individual frequencies are set such as to set the least effect situation.

Thus, it is possible to obtain the setting of the oscillation frequencies of the first and second local oscillators (or synthesizers) and also the setting of the logic polarities based on the frequencies that are set in entirely automatic operations, and thus it is possible to obtain very simple and ready receiver setting operations.

Further, where the call signal frequencies are varied for using the receiver in different areas, by switching the frequencies that are selected in the second ROM, it is subsequently possible to obtain an entirely automatic setting of suitable frequencies. The first to third CPUs in the above embodiment may of course be constituted by a single CPU.

As has been described in the foregoing, according to the present invention frequency calculation is done so that the harmonics of the oscillation frequency of either one of the first and second local oscillators do not act as interference frequencies to the other oscillation frequency, the harmonics thereof, and the received signal frequency, and the oscillation frequency of each local oscillator is determined as a result of the calculation. Thus, it is possible to set the oscillation frequency of each local oscillator automatically to a suitable frequency according to the received signal frequency.

Further, with the provision of means for switching the data polarity of the received signal frequency according to the oscillation frequencies set for the first and second local oscillators, it is possible to obtain an entirely automatic setting of the polarity of the logic of the obtained data, thus further facilitating the receiver setting operations.

What is claimed is:

1. A radio selective calling receiver comprising:
   first and second local oscillators constituted by respective synthesizers, and
   control means for controlling the oscillation frequencies of the local oscillators, the control means including:
   frequency setting means for setting original and optimum oscillation frequencies of said local oscillators; and
   frequency calculation means for calculating said optimum oscillation frequencies for said local oscillators according to the received call signal frequency after said frequency setting means sets said original oscillation frequency, the original oscillation frequencies of said local oscillators and the harmonic frequencies of said local oscillators to minimize harmonic distortion between said optimum oscillation frequencies and said received signal frequency, and for verifying that said calculated optimum oscillation frequencies are acceptable according to a predetermined standard, during normal operation of said receiver and before said frequency setting means sets said optimum oscillation frequencies.

2. The radio selective calling receiver according to claim 1, wherein the control means includes means for switching the data polarity of the received signal according to the oscillation frequencies set in the first and second local oscillators.

3. A radio selective calling receiver comprising:
   a first synthesizer for generating an oscillation signal of a first higher frequency $f_{L1U}$ signal and a first lower frequency $f_{L1L}$ signal which are higher and lower than a first local oscillator frequency, respectively;
   a second synthesizer for generating a second higher frequency $f_{L2U}$ signal and a second lower frequency $f_{L2L}$ signal higher and lower than a second local oscillator frequency, respectively;
   memory means for storing call signal frequency data which are set for respective areas;
   an antenna for receiving a call signal;
   a first mixer for mixing the received signal with an output signal from the first signal synthesizer for conversion to a first intermediate frequency $\Delta f_1$;
   a second mixer for mixing the first intermediate frequency signal with an output signal from the second synthesizer for conversion to a second intermediate frequency $\Delta f_2$;
   a detector for detecting the signal of the second intermediate frequency;
   a first means for setting the oscillation frequencies of the first and second synthesizer to $f_{L1L}$ and $f_{L2L}$, respectively;
   a second means for checking whether harmonics of the second lower frequency $f_{L2L}$ from the second synthesizer act as interference frequencies with respect to the call signal frequency $f_0$ read out from the memory means or the first lower frequency $f_{L1L}$ signal from the first synthesizer during normal operation of said receiver after said first means sets said oscillation frequencies of said first and second synthesizers; and
   a third means for further setting, if there are not allowable harmonics acting as interference frequencies during normal operation of said receiver, the oscillation frequencies of the first and second synthesizers to alternate frequencies and calculating harmonics during normal operation of said receiver until said oscillation frequencies produce allowable harmonics acting as interference frequencies.

4. The radio selective calling receiver according to claim 3, wherein further comprising:
   a fourth means for setting, if it is found that the oscillation frequency $f_{L2L}$ signal of the second synthesizer is prone to interference, the oscillation frequency of the second synthesizer to the second higher frequency $f_{L2U}$;
   a fifth means for checking whether harmonics of the second higher frequency $f_{L2U}$ from the second synthesizer act as interference frequencies with respect to the call signal frequency $f_0$ read out from the memory means or the first lower frequency $f_{L1L}$ from the first synthesizer; and
   a sixth means for setting, if there is allowable harmonic acting as interference frequency, the oscillation frequencies of the first and second synthesizers to $f_{L1L}$ and $f_{L2U}$.

5. The radio selective calling receiver according to claim 4, further comprising:
   a seventh means for setting, if it is found that there is an interference frequency, the oscillation frequencies of the first and second synthesizers to the first higher frequency and second lower frequency $f_{L1U}$ and $f_{L2L}$, respectively;

an eighth means for checking whether harmonics of the second lower frequency $f_{L2L}$ from the second synthesizer act as interference frequencies with respect to the call signal frequency $f_0$ read out from the memory means or the first lower frequency $f_{L1U}$ from the first synthesizer; and a ninth means for setting, if there is allowable harmonic acting as interference frequency, the oscillation frequencies of the first and second synthesizers to $f_{L1U}$ and $f_{L2L}$.

6. The radio selective calling receiver according to claim 5, further comprising:

a tenth means for setting, if there still is interference, the oscillation frequencies of the first and second synthesizers to the first higher frequency and second higher frequency $f_{L1U}$ and $f_{L2U}$, respectively.

7. The radio selective calling receiver according to claim 6, further comprising an eleventh means for setting, if selecting any oscillation frequencies of the first and second synthesizers leads to an interference situation the individual frequencies such as to set the least effect of the intermediate frequency situation.

8. A heterodyne receiver comprising;

a first synthesizer for generating an oscillation signals of a first higher frequency $f_{L1U}$ signal and a first lower frequency $f_{L1L}$ signal which are higher and lower than a first local oscillator frequency, respectively;

a second synthesizer for generating a second higher frequency $f_{L2U}$ signal and a second lower frequency $f_{L2L}$ signal higher and lower than a second local oscillator frequency, respectively;

memory means for storing call signal frequency data which are set for respective areas;

an antenna for receiving a call signal;

a first mixer for mixing the received signal with an output signal from the first synthesizer for conversion to a first intermediate frequency $\Delta f_1$;

a second mixer for mixing the first intermediate frequency signal with an output signal from the second synthesizer for conversion to a second intermediate frequency $\Delta f_2$;

a detector for detecting the signal of the second intermediate frequency;

a first means for setting the oscillation frequencies of the first and second synthesizer to $f_{L1L}$ and $f_{L2L}$, respectively;

a second means for checking whether harmonics of the second lower frequency $f_{L2L}$ from the second synthesizer act as interference frequencies with respect to the call signal frequency $f_0$ read out from the memory means or the first lower frequency $f_{L1L}$ signal from the first synthesizer during normal operation of said receiver after said first means sets said oscillation frequencies of said first and second synthesizers; and a third means for further setting, if there are not allowable harmonics acting as interference frequencies during normal operation of said receiver, the oscillation frequencies of the first and second synthesizers to alternate frequencies and calculating harmonics during normal operation of said receiver until said oscillation frequencies produce allowable harmonics acting as interference frequencies.

9. The heterodyne receiver according to claim 8, wherein further comprising:

a fourth means for setting, if it is found that the oscillation frequency $f_{L2L}$ signal of the second synthesizer is prone to interference, the oscillation frequency of the second synthesizer to the second higher frequency $f_{L2U}$;

a fifth means for checking whether harmonics of the second higher frequency $f_{L2U}$ from the second synthesizer act as interference frequencies with respect to the call signal frequency $f_0$ read out from the memory means or the first lower frequency $f_{L1L}$ from the first synthesizer; and a sixth means for setting, if there is allowable harmonic acting as interference frequency, the oscillation frequencies of the first and second synthesizers to $f_{L1L}$ and $f_{L2U}$.

10. The heterodyne receiver according to claim 9, further comprising:

a seventh means for setting, if it is found that there is an interference frequency, the oscillation frequencies of the first and second synthesizers to the first higher frequency and second lower frequency $f_{L1U}$ and $f_{L2L}$, respectively;

an eighth means for checking whether harmonics of the second lower frequency $f_{L2L}$ from the second synthesizer act as interference frequencies with respect to the call signal frequency $f_0$ read out from the memory means or the first lower frequency $f_{L1U}$ from the first synthesizer; and a ninth means for setting, if there is allowable harmonic acting as interference frequency, the oscillation frequencies of the first and second synthesizers to $f_{L1U}$ and $f_{L2L}$.

11. The heterodyne receiver according to claim 10, further comprising:

a tenth means for setting, if there still is interference, the oscillation frequencies of the first and second synthesizers to the first higher frequency and second higher frequency $f_{L1U}$ and $f_{L2U}$, respectively.

12. The heterodyne receiver according to claim 11, further comprising an eleventh means for setting, if selecting any oscillation frequencies of the first and second synthesizers leads to an interference situation the individual frequencies such as to set the least effect of the intermediate frequency situation.

* * * * *